US010831221B1

(12) United States Patent
Tesch (10) Patent No.: US 10,831,221 B1
(45) Date of Patent: Nov. 10, 2020

(54) LOW DROP-OUT (LDO) VOLTAGE REGULATOR WITH DIRECT AND INDIRECT COMPENSATION CIRCUIT

(71) Applicant: Qorvo US, Inc., Greensboro, NC (US)

(72) Inventor: Bruce John Tesch, Melbourne, FL (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 16/508,468

(22) Filed: Jul. 11, 2019

(51) Int. Cl.
*G05F 1/575* (2006.01)
*H01L 29/49* (2006.01)

(52) U.S. Cl.
CPC .......... *G05F 1/575* (2013.01); *H01L 29/4916* (2013.01)

(58) Field of Classification Search
CPC . G05F 1/165; G05F 1/56; G05F 1/575; G05F 1/562; G05F 1/565
USPC ........................... 323/273–281; 327/534–541
See application file for complete search history.

(56) References Cited

U.S. PATENT DOCUMENTS

| | | | | |
|---|---|---|---|---|
| 2005/0184711 A1* | 8/2005 | Chen | .................. | G05F 1/575 323/280 |
| 2009/0152678 A1* | 6/2009 | Kang | .................. | H01L 23/5223 257/532 |
| 2015/0070084 A1* | 3/2015 | Kumazaki | ............... | G05F 1/462 327/537 |

OTHER PUBLICATIONS

Yavari, Mohammad, et al., "A new compensation technique for two-stage CMOS operational transconductance amplifiers," International Conference on Acoustics, Speech, and Signal Processing, Apr. 2003, Hong Kong, China, IEEE, 4 pages.

* cited by examiner

*Primary Examiner* — Nguyen Tran
(74) *Attorney, Agent, or Firm* — Withrow & Terranova, P.L.L.C.

(57) ABSTRACT

A low drop-out (LDO) voltage regulator employs combined compensation methods for reduced capacitor area. Frequency compensation internal to a LDO voltage regulator is accomplished by introducing a metal-insulator-metal (MIM) compensation capacitor in series with a compensation resistor between an input to a second stage of the LDO voltage regulator and a regulator output. This achieves a good settling response over a wide range of load conditions at the expense of relatively large capacitor area. Alternatively, a metal-oxide semiconductor (MOS) compensation capacitor may be coupled between an intermediate node of a cascode circuit in a first stage of the LDO voltage regulator and the regulator output. This requires less capacitor area but exhibits instability at some corners. In combination, a good settling response over all corners may be achieved with stacked MIM/MOS capacitors occupying significantly less area than the MIM capacitor of the first method alone.

15 Claims, 7 Drawing Sheets

LOW DROP-OUT (LDO) VOLTAGE REGULATOR WITH DIRECT AND INDIRECT COMPENSATION CIRCUIT

FIELD OF THE DISCLOSURE

The present disclosure relates generally to circuits for providing power to a circuit and, more specifically, to power supply circuits for providing stable, low-noise direct-current (DC) output voltage.

BACKGROUND

The functions of consumer electronic devices are made possible by integrated circuits, which are powered by a direct-current (DC) supply voltage. The DC supply voltage may not be the same as the voltage of a power source, such as a battery, powering the integrated circuits, so a voltage regulator may be used to regulate the supply voltage. A low drop-out (LDO) voltage regulator is a DC linear voltage regulator that can regulate the output voltage to an integrated circuit even when the source voltage is very close to the output voltage. As the integrated circuit operates and transistors therein turn on and off, the integrated circuit presents a changing load to the voltage regulator. Changes to the load can cause a sudden increase or decrease (i.e., transient) in the supply voltage at the voltage regulator output. Transients affecting the voltage regulator may also be received through the source voltage from the battery or other power source, which may also be providing power to other circuits. In response to a sudden variation in the supply voltage, an integrated circuit can fail to operate correctly, causing errors that may affect operation of device applications, for example. To monitor and control variations in the supply voltage, a feedback value based on the supply voltage is compared to a reference value, and the difference, if any, is used to dynamically adjust the supply voltage at the voltage regulator output. However, depending on the frequency of a transient, the feedback can cause unintended changes, such as oscillations, in the supply voltage. In this regard, a compensation circuit is included in the voltage regulator to ensure a good transient response (one with minimal undershoot, overshoot, or ringing).

SUMMARY

Aspects disclosed herein include a low drop-out (LDO) voltage regulator with a stacked capacitor compensation circuit. LDO voltage regulators are used in electronic devices to supply, to a load circuit, a stable and precise output voltage that may be close to a source voltage. The LDO voltage regulator may include a first gain stage, a second gain stage, and a compensation circuit providing feedback from a supply voltage at the output of the LDO voltage regulator. The compensation circuit is needed to provide stability in the supply voltage in response to sudden changes inside the LDO voltage regulator caused by changes in load or transients in the source voltage. The LDO voltage regulator can be implemented in an integrated circuit whose performance depends on variations in process, temperature, source voltage, load capacitance, and resistance. Henceforth, the minimum/maximum limits of these variations shall simply be referred to as corners.

To provide a good transient response over all process corners of a LDO voltage regulator, a first example of a compensation circuit may provide direct feedback to the input of the second gain stage. A direct compensation circuit includes a compensation capacitor and a compensation resistor coupled in series between the regulator output and the input to the second gain stage. However, the direct compensation circuit may require a large metal-insulator-metal (MIM) compensation capacitor that occupies a large area of the integrated circuit. In an alternative example, a compensation circuit can provide indirect feedback through a compensation capacitor coupled between the regulator output and a low impedance node of the first gain stage of the LDO voltage regulator. The compensation capacitor in an indirect compensation circuit can be a metal-oxide-semiconductor (MOS) capacitor that is formed directly on the substrate and occupies significantly less area than the MIM capacitor of the direct compensation circuit. Unfortunately, the transient response of the LDO voltage regulator with the indirect compensation circuit may not exhibit a good transient response over all corners.

As disclosed herein, an exemplary LDO voltage regulator including a compensation circuit combines direct feedback through a MIM capacitor and indirect feedback through a MOS capacitor to achieve a good settling response over all corners with a significant reduction in area of an integrated circuit compared to the direct compensation circuit. Employing the combined compensation circuit disclosed herein, a transient response of the LDO voltage regulator may be similar to that of the direct compensation circuit disclosed above, but the area is significantly reduced. In this regard, the LDO voltage regulator includes a stacked MIM/MOS compensation capacitor structure, such that the MIM capacitor and the MOS capacitor in the combined compensation circuit occupy the same horizontal area of an integrated circuit. Thus, the LDO voltage regulator achieves a good settling response over all corners with a significant reduction in total area.

In one aspect, a low drop-out (LDO) voltage regulator is disclosed. The LDO voltage regulator includes a first gain stage, a second gain stage, and a compensation circuit. The first gain stage includes a cascode differential amplifier including a differential pair and a first cascode circuit. The differential pair is configured to generate a voltage difference between a first differential node and a second differential node based on a difference between a reference voltage and a feedback voltage. The first cascode circuit is coupled between the first differential node and a first cascode output node. The second gain stage of the LDO voltage regulator is configured to generate a supply voltage on a regulator output based on a first output voltage at the first cascode output node. The compensation circuit of the LDO voltage regulator includes a compensation resistor coupled between the regulator output and a compensation node, a first compensation capacitor coupled between the compensation node and the first cascode output node, and a second compensation capacitor coupled between the compensation node and the first differential node.

BRIEF DESCRIPTION OF THE DRAWING FIGURES

The accompanying drawing figures incorporated in and forming a part of this specification illustrate several aspects of the disclosure and, together with the description, serve to explain the principles of the disclosure.

DETAILED DESCRIPTION

Those skilled in the art will appreciate the scope of the present disclosure and realize additional aspects thereof after reading the following detailed description of the preferred embodiments in association with the accompanying drawing figures.

Aspects disclosed herein include a low drop-out (LDO) voltage regulator with a stacked capacitor compensation circuit. LDO voltage regulators are used in electronic devices to supply, to a load circuit, a stable and precise output voltage that may be close to a source voltage. The LDO voltage regulator may include a first gain stage, a second gain stage, and a compensation circuit providing feedback from a supply voltage at the output of the LDO voltage regulator. The compensation circuit is needed to provide stability in the supply voltage in response to sudden changes inside the LDO voltage regulator caused by changes in load or transients in the source voltage. The LDO voltage regulator can be implemented in an integrated circuit whose performance varies widely over all possible corners, as previously described.

To provide a good transient response over all corners of a LDO voltage regulator, a first example of a compensation circuit may provide direct feedback to the input of the second gain stage. A direct compensation circuit includes a compensation capacitor and a compensation resistor coupled in series between the regulator output and the input to the second gain stage. However, the direct compensation circuit may require a large metal-insulator-metal (MIM) compensation capacitor that occupies a large area of the integrated circuit. In an alternative example, a compensation circuit can provide indirect feedback through a compensation capacitor coupled between the regulator output and a low impedance node of the first gain stage of the LDO voltage regulator. The compensation capacitor in an indirect compensation circuit can be a metal-oxide-semiconductor (MOS) capacitor that is formed directly on the substrate and occupies significantly less area than the MIM capacitor of the direct compensation circuit. Unfortunately, the transient response of the LDO voltage regulator with the indirect compensation circuit may not exhibit good transient response over all corners.

As disclosed herein, an exemplary LDO voltage regulator including a compensation circuit combines direct feedback through a MIM capacitor and indirect feedback through a MOS capacitor to achieve a good settling response over all corners with a significant reduction in area of an integrated circuit compared to the direct compensation circuit. Employing the combined compensation circuit disclosed herein, a transient response of the LDO voltage regulator may be similar to that of the direct compensation circuit disclosed above, but the area is significantly reduced. In this regard, the LDO voltage regulator includes a stacked MIM/MOS compensation capacitor structure, such that the MIM capacitor and the MOS capacitor in the combined compensation circuit occupy the same horizontal area of an integrated circuit. Thus, the LDO voltage achieves a good settling response over all corners with a significant reduction in total area.

Figure 1A:
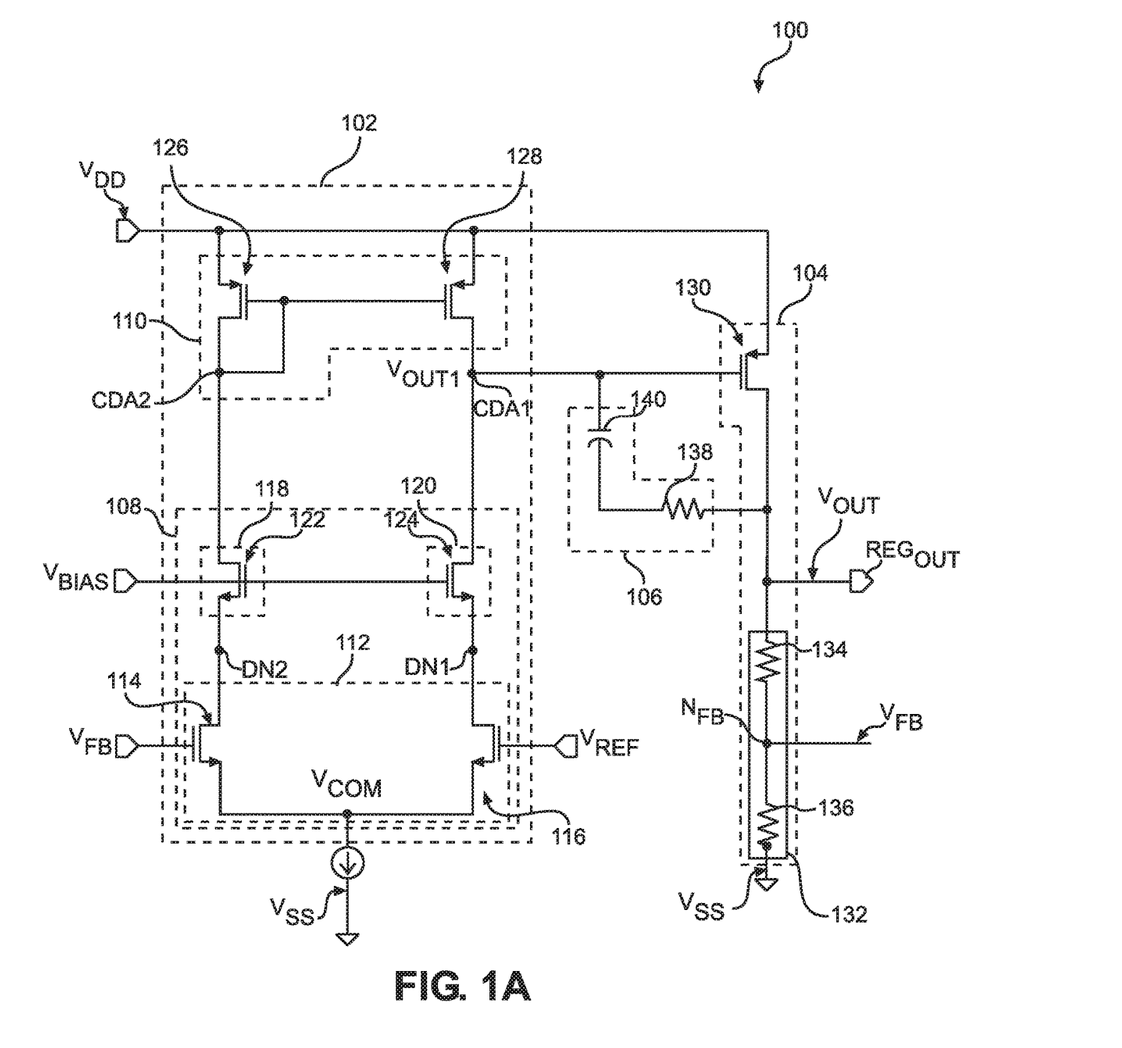
FIG. 1A is a schematic diagram of a low drop-out (LDO) voltage regulator including a first gain stage, a second gain stage, and a direct compensation circuit.

FIG. 1A is a schematic diagram of a LDO voltage regulator 100 configured to provide a supply voltage $V_{OUT}$ on a regulator output $REG_{OUT}$. The LDO voltage regulator 100 receives a source voltage $V_{DD}$ from a voltage source and a reference voltage $V_{REF}$ from a reference source. The LDO voltage regulator 100 generates a stable supply voltage $V_{OUT}$ on the regulator output $REG_{OUT}$ to power a circuit. The supply voltage $V_{OUT}$ may range from a few volts down to only 0.1 volt (V), for example, less than the source voltage $V_{DD}$. Variations in the supply voltage $V_{OUT}$ are identified by a difference between the reference voltage $V_{REF}$ and a feedback voltage $V_{FB}$, which is based on the supply voltage $V_{OUT}$. The supply voltage $V_{OUT}$ is adjusted to minimize the difference. The LDO voltage regulator 100 includes a first gain stage 102, a second gain stage 104, and a compensation circuit 106. The first gain stage 102 generates an output voltage $V_{OUT1}$ based on a difference between the reference voltage $V_{REF}$ and the feedback voltage $V_{FB}$. The second gain stage 104 amplifies this output voltage $V_{OUT1}$ to generate the supply voltage $V_{OUT}$. The feedback voltage $V_{FB}$ will be equal to the reference voltage $V_{REF}$ if the regulator output $REG_{OUT}$ is at the intended supply voltage $V_{OUT}$ of the LDO voltage regulator 100.

The first gain stage 102 includes a cascode differential amplifier 108 and a current mirror circuit 110. The cascode differential amplifier 108 is configured to amplify the voltage difference between the reference voltage $V_{REF}$ and the feedback voltage $V_{FB}$. The current mirror circuit 110 converts the amplified voltage difference to a single-ended output voltage $V_{OUT1}$ at a first cascode output node CDA1 of the first gain stage 102. The second gain stage 104 is configured to generate the supply voltage $V_{OUT}$ on the regulator output $REG_{OUT}$ based on the output voltage $V_{OUT1}$ at the first cascode output node CDA1.

The cascode differential amplifier 108 in the first gain stage 102 includes a differential pair 112 configured to generate a voltage difference between a first differential node DN1 and a second differential node DN2 based on a difference between the reference voltage $V_{REF}$ and the feedback voltage $V_{FB}$. The differential pair 112 includes a first transistor 114 and a second transistor 116, each of which includes a control node, a first current node and a second current node. The first transistor 114 and the second transistor 116 may be field-effect transistors (FETs) or bipolar junction transistors (BJTs) but are not limited to those devices, as will be appreciated by one skilled in the art. The control node of the first transistor 114 is configured to receive the feedback voltage $V_{FB}$, and the control node of the second transistor 116 is configured to receive the reference voltage $V_{REF}$. The first current node of the first transistor 114 and the first current node of the second transistor 116 are each coupled to a common voltage $V_{COM}$ which is coupled to a current source. The second current node of the first transistor 114 is coupled to the second differential node DN2, and the second current node of the second transistor 116 is coupled to the first differential node DN1.

The cascode differential amplifier 108 further includes a second cascode circuit 118 coupled between the second differential node DN2 and a second cascode output node CDA2, and a first cascode circuit 120 coupled between the first differential node DN1 and the first cascode output node CDA1. The first cascode circuit 120 includes a first cascode transistor 124, and the second cascode circuit 118 includes a second cascode transistor 122. The first cascode transistor 124 and the second cascode transistor 122 may be FETs or BJTs but are not limited to those devices, as will be appreciated by one skilled in the art. Each of the first cascode transistor 124 and the second cascode transistor 122 includes a control node, a first current node, and a second current node. The control node of the first cascode transistor 124 and the control node of the second cascode transistor 122 are each coupled to a bias voltage $V_{BIAS}$. The first current node of the first cascode transistor 124 is coupled to the first differential node DN1, and the second current node of the first cascode transistor 124 is coupled to the first cascode output node CDA1. The first current node of the second cascode transistor 122 is coupled to the second differential node DN2, and the second current node of the second cascode transistor 122 is coupled to the second cascode output node CDA2.

The current mirror circuit 110 of the first gain stage 102 converts the current difference between the first cascode output node CDA1 and the second cascode output node CDA2 into the single-ended output voltage $V_{OUT1}$. The current mirror circuit 110 includes a gate-drain shorted transistor 126 with a control node and a first current node that are both coupled to the second cascode output node CDA2. A second current node of the gate-drain shorted transistor 126 is configured to receive a source voltage $V_{DD}$ from a voltage source (not shown). The current mirror circuit 110 also includes a mirror transistor 128 including a control node that is also coupled to the second cascode output node CDA2. The mirror transistor 128 includes a first current node coupled to the first cascode output node CDA1 and a second current node configured to receive the source voltage $V_{DD}$ from the voltage source. The gate-drain shorted transistor 126 and the mirror transistor 128 may be FETs or BJTs but are not limited to those devices, as will be appreciated by one skilled in the art. The second gain stage 104 generates the supply voltage $V_{OUT}$ at the regulator output $REG_{OUT}$ based on the output voltage $V_{OUT1}$ at the first cascode output node CDA1 of the first gain stage 102. The second gain stage 104 includes a gain transistor 130, which may be a FET, BJT, or other device, coupled to a voltage divider 132 at the regulator output $REG_{OUT}$. The gain transistor 130 includes a control node coupled to the first cascode output node CDA1. The gain transistor 130 includes a first current node coupled to the regulator output $REG_{OUT}$ and a second current node configured to receive the source voltage $V_{DD}$ from the voltage source. The gain transistor 130 passes a current from the second current node to the first current node based on the output voltage $V_{OUT1}$ received at the control node. The second gain stage 104 also includes the voltage divider 132 including a first divider resistor 134 and a second divider resistor 136. The first divider resistor 134 is coupled between the regulator output $REG_{OUT}$ and a feedback node $N_{FB}$. The second divider resistor 136 is coupled between the feedback node $N_{FB}$ and the ground voltage $V_{SS}$. The second gain stage 104 is configured to generate the feedback voltage $V_{FB}$ on the feedback node $N_{FB}$.

The compensation circuit 106 is included in the LDO voltage regulator 100 to improve transient response by providing direct compensation. The compensation circuit 106 includes a compensation resistor 138 in series with a compensation capacitor 140 coupled between the regulator output $REG_{OUT}$ and the first cascode output node CDA1. Specifically, the compensation resistor 138 is coupled to the regulator output $REG_{OUT}$ and the compensation capacitor 140 which is coupled between the compensation resistor 138 and the first cascode output node CDA1. An important indication of the transient response of the LDO voltage regulator 100 in FIG. 1A is how the voltage level on the regulator output $REG_{OUT}$ changes in response to the transient that occurs when power is activated (i.e., turned on). Ideally, a voltage level at the regulator output $REG_{OUT}$ rises quickly from 0 V to the supply voltage $V_{OUT}$ (e.g., 2.9 V) without overshooting (i.e., exceeding) or undershooting (i.e., falling short). In actual circuits, depending on the particular corner condition of the circuit and other parameters, the voltage at the regulator output $REG_{OUT}$ may oscillate between voltage levels above and below the supply voltage $V_{OUT}$ before settling to the supply voltage $V_{OUT}$. In some cases, the voltage at the regulator output $REG_{OUT}$ may undershoot, not immediately rising all the way to the supply voltage $V_{OUT}$. In a LDO voltage regulator having a good transient response, the supply voltage $V_{OUT}$ at the regulator output $REG_{OUT}$ will ramp up quickly from 0 V and settle quickly at the supply voltage $V_{OUT}$, with minimum overshoot or undershoot under all corner conditions.

Figure 1B:
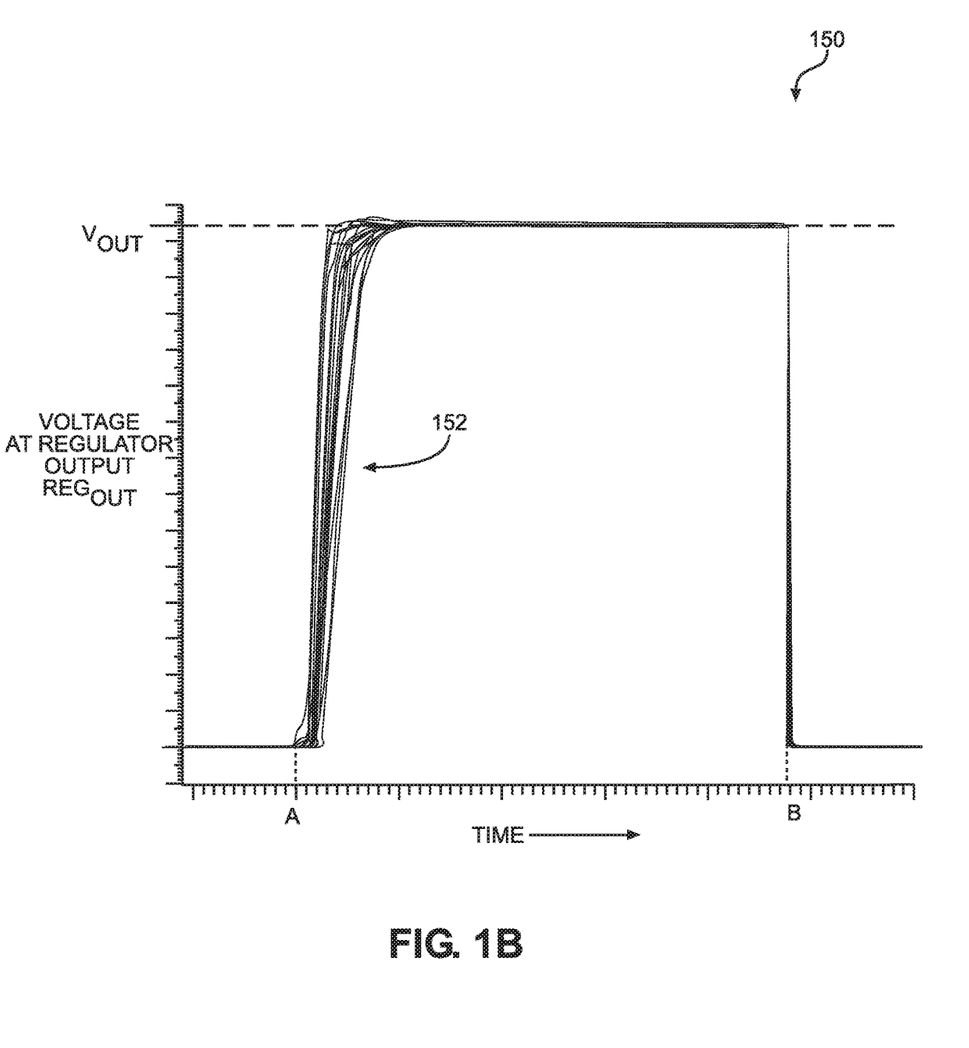
FIG. 1B is a diagram illustrating a simulated supply voltage at the regulator output of the LDO voltage regulator in FIG. 1A over a plurality of corners in response to a transient created by activating a power source.

A diagram 150 in FIG. 1B illustrates the simulated transient response of the LDO voltage regulator 100 in FIG. 1A. In particular, the diagram 150 in FIG. 1B is a graph of the supply voltage $V_{OUT}$ at the regulator output $REG_{OUT}$ over a time in which the power is activated (i.e., time A) and deactivated (i.e., time B). Each of traces 152 in the diagram 150 in FIG. 1B represents a different corner condition of the circuitry in the LDO voltage regulator 100. As shown, there are minor differences among the traces 152 with respect to: 1) a time between enabling power at time A and the voltage beginning to increase at the regulator output $REG_{OUT}$; 2) the rate or slope of voltage increase; and 3) the magnitude and duration of voltage fluctuations above and below the supply voltage $V_{OUT}$ before settling at the supply voltage $V_{OUT}$. Ideally, the transient response would be the same for all corner conditions. The minor differences between respective corner conditions shown in the diagram 150 are within an acceptable range, so the LDO voltage regulator 100 is considered to have a good transient response to the power being activated. The compensation capacitor 140 in the LDO voltage regulator 100 may be subjected to the full source voltage $V_{DD}$ (e.g., 5.5 V) under some circuit conditions, so the compensation capacitor 140 must be capable of handling (i.e., being charged to) the source voltage $V_{DD}$ without damage. Accordingly, the compensation capacitor 140 is implemented as a metal-insulator-metal (MIM) capacitor. Achieving the transient response shown in FIG. 1B requires the compensation capacitor 140 to have a certain level of capacitance $C_{DIRECT}$, which may correspond to an area of 3000 square micrometers ($\mu m^2$), in the example in FIG. 1A. Thus, the compensation capacitor 140 occupies an area of 3000 $\mu m^2$ of two metal layers of an integrated circuit in which the LDO voltage regulator 100 is formed, which prevents vertical interconnect access (via) structures from being formed to higher metal layers in such area, and increases wiring congestion in the metal layers of the LDO voltage regulator 100 in which the electrodes of the compensation capacitor 140 are formed. Thus, although the direct compensation circuit 106 provides a good transient response, the large area occupied by the MIM capacitor forming the compensation capacitor 140 limits the minimize size to which the LDO voltage regulator 100 can be reduced.

Figure 2A:
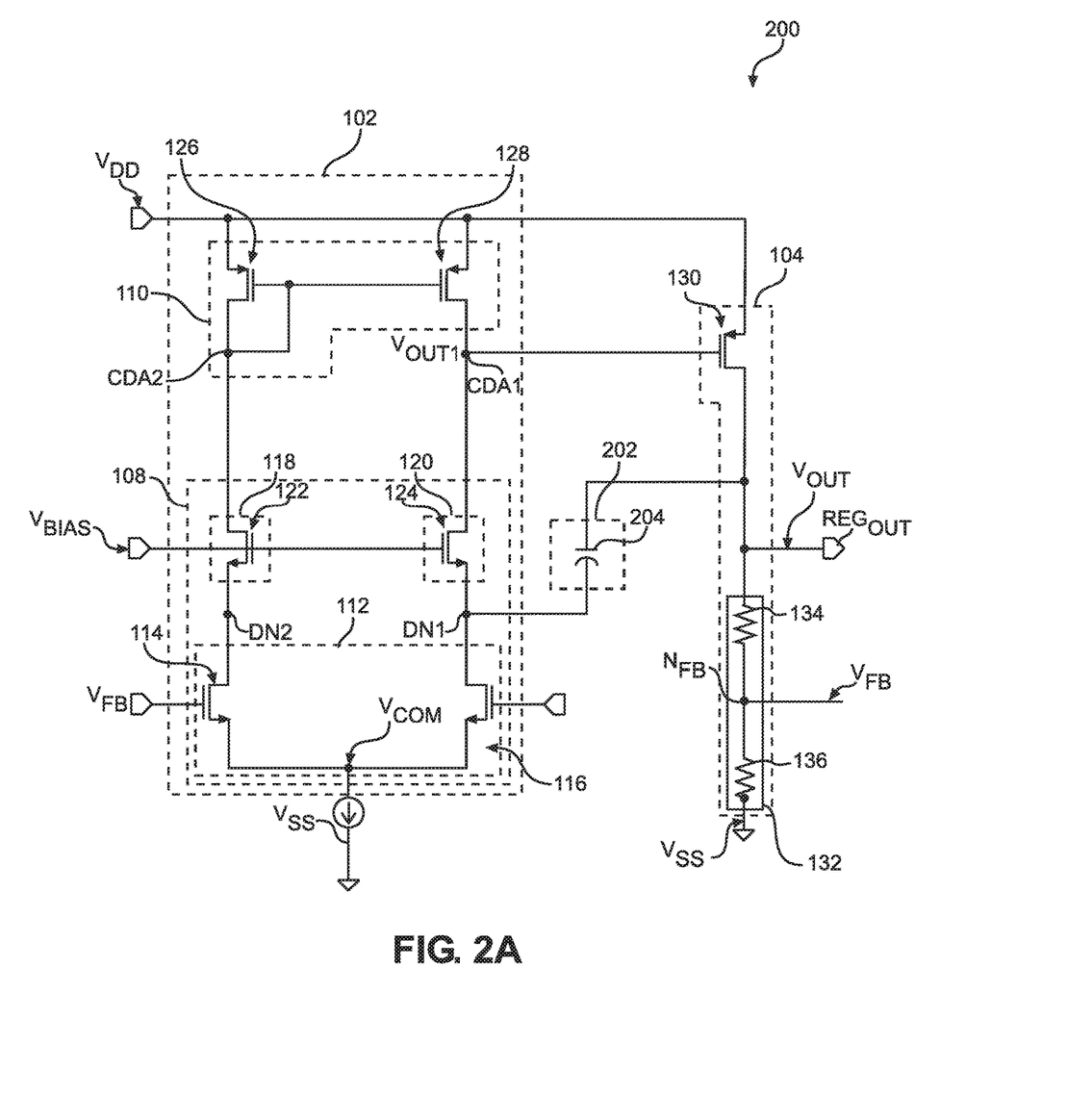
FIG. 2A is a schematic diagram of a LDO voltage regulator including a first gain stage, a second gain stage, and an indirect compensation circuit.

FIG. 2A is a schematic diagram of a LDO voltage regulator 200 including the first gain stage 102 and the second gain stage 104 of the LDO voltage regulator 100 in FIG. 1A. However, in contrast to the compensation circuit 106 of the LDO voltage regulator 100 in FIG. 1A, the LDO voltage regulator 200 includes a compensation circuit 202. As discussed above with reference to FIG. 1A, the first gain stage 102 includes the cascode differential amplifier 108, which further includes the differential pair 112 coupled to the first cascode circuit 120 at the first differential node DN1 and coupled to the second cascode circuit 118 at the second differential node DN2. In addition, the second gain stage 104 includes the gain transistor 130 coupled to the voltage divider 132 at the regulator output $REG_{OUT}$. In regard to these and all other aspects, the first gain stage 102 and the second gain stage 104 of FIG. 2A are the same as described with regard to FIG. 1A, so a description thereof will not be repeated.

The compensation circuit 202 includes a compensation capacitor 204 coupled between the regulator output $REG_{OUT}$ and the first differential node DN1, which is a low-impedance node internal to the first gain stage 102, to provide indirect compensation. The compensation capacitor 204 will not be subjected to the full source voltage $V_{DD}$, so the compensation capacitor 204 may be formed as a metal-oxide-semiconductor (MOS) capacitor on a semiconductor substrate. A capacitance $C_{IND}$ needed for the compensation capacitor 204 may require the MOS capacitor to have an area in the range of 1600 μm$^2$, for example. However, the compensation capacitor 204 may be larger or smaller than 1600 μm$^2$.

Figure 2B:
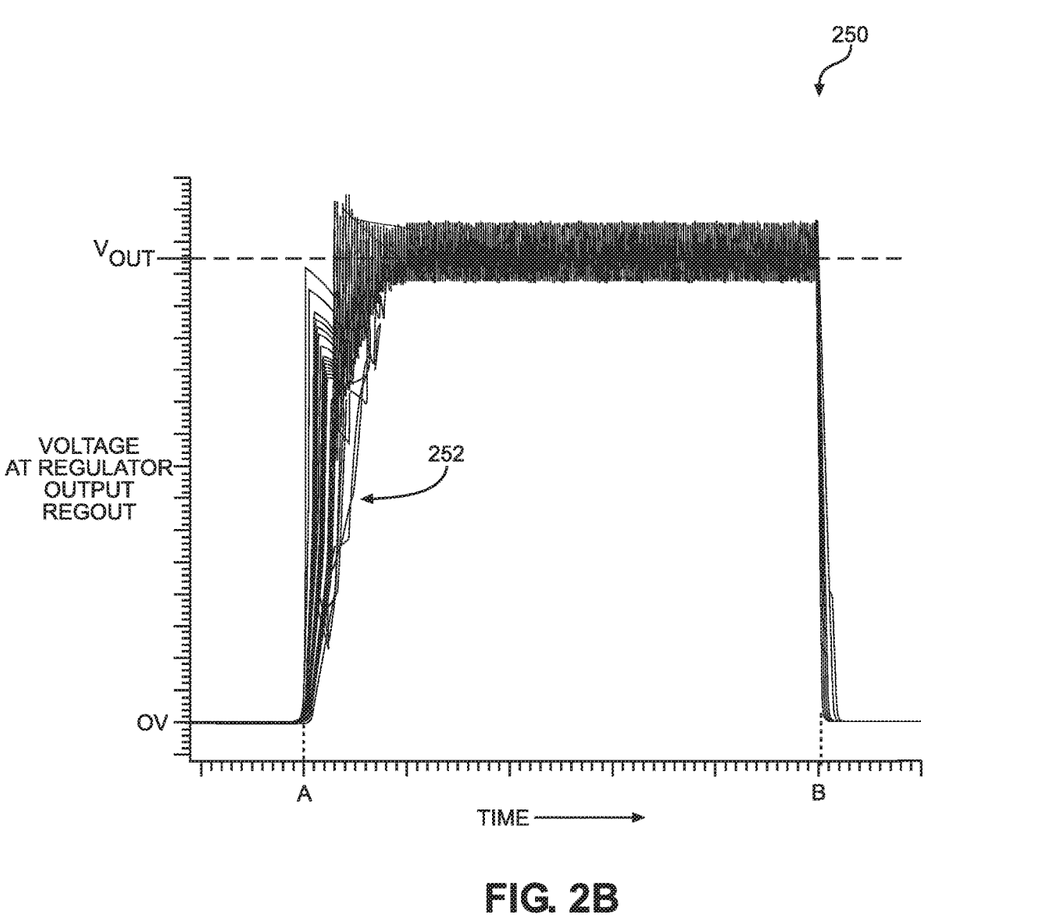
FIG. 2B is a diagram illustrating the simulated supply voltage at the regulator output of the LDO voltage regulator in FIG. 2A over a plurality of corners in response to a transient created by activating the power source.

A diagram 250 in FIG. 2B illustrates the simulated transient response of the LDO voltage regulator 200 in FIG. 2A. Traces 252 illustrate the voltage at the regulator output $REG_{OUT}$ under different corner conditions. Compared to the traces 152 in the diagram 150 of FIG. 1B, the traces 252 do not quickly rise from 0 V to the supply voltage $V_{OUT}$ and do not settle quickly at the supply voltage $V_{OUT}$. Some corners exhibit a sustained oscillation. Thus, even though the area occupied by the MOS compensation capacitor 204 may be roughly half (53%) of the area occupied by the MIM compensation capacitor 140 in the LDO voltage regulator 100, the transient response of the LDO voltage regulator 200 in FIG. 2A including the indirect compensation circuit 202 is significantly worse than the transient response of the LDO voltage regulator 100 in FIG. 1A.

Figure 3A:
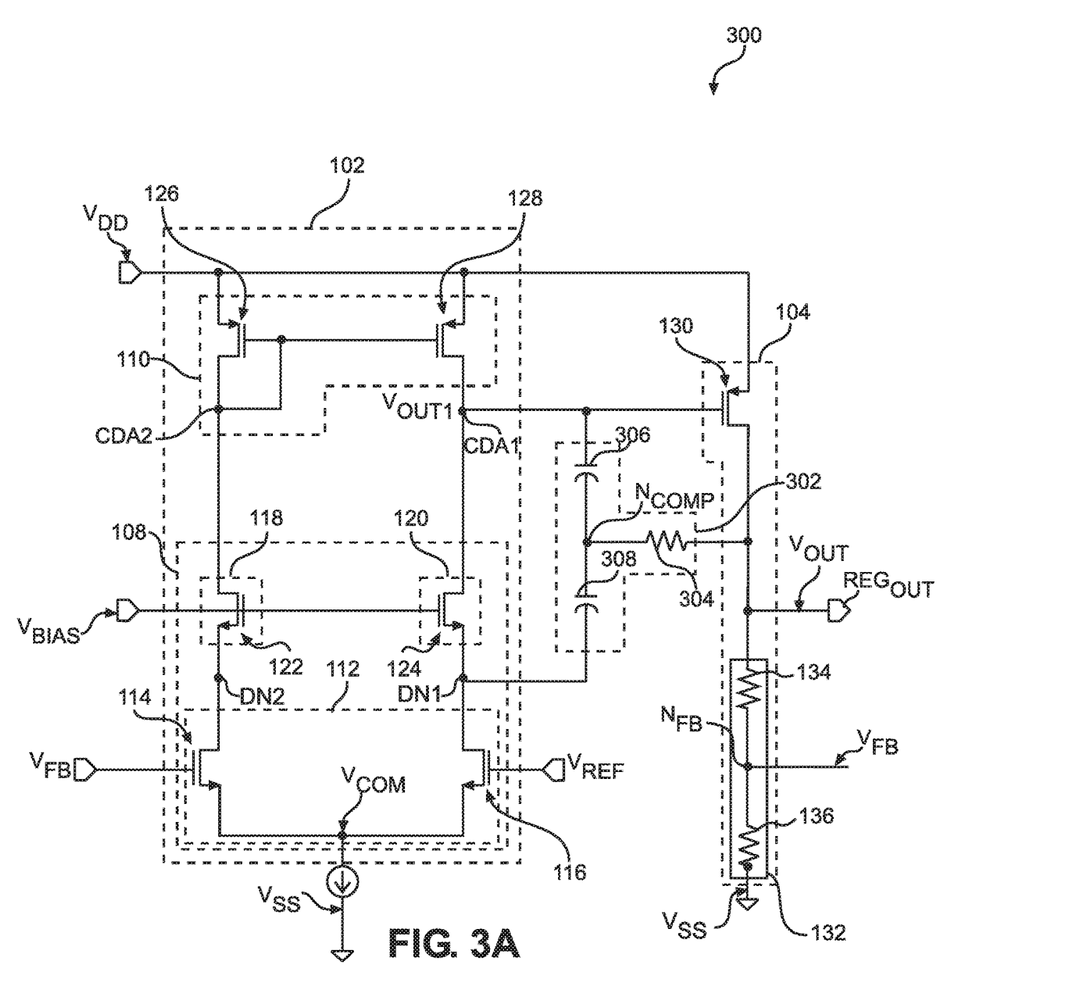
FIG. 3A is a schematic diagram of an exemplary LDO voltage regulator including a first gain stage, a second gain stage, and a combined compensation circuit including a metal-insulator-metal/metal-oxide-semiconductor (MIM/MOS) stacked capacitor structure providing direct and indirect compensation resulting in a good transient response over all corners in a reduced integrated circuit area.

FIG. 3A is a schematic diagram of an exemplary LDO voltage regulator 300 including the first gain stage 102, the second gain stage 104, and a compensation circuit 302 to provide a good transient response over all corners in a reduced integrated circuit area. The first gain stage 102 and the second gain stage 104 of FIG. 3A are the same as described with regard to FIG. 1A, so a description thereof will not be repeated here. The LDO voltage regulator 300 has a good transient response, similar to that of the LDO voltage regulator 100 of FIG. 1A, while reducing the area occupied by a MIM capacitor by about 60%. The compensation circuit 302 includes a compensation resistor 304 coupled between the regulator output $REG_{OUT}$ and a compensation node $N_{COMP}$. The compensation circuit 302 also includes a first compensation capacitor 306 and a second compensation capacitor 308. The first compensation capacitor 306 is coupled between the compensation node $N_{COMP}$ and the first cascode output node CDA1, and the second compensation capacitor 308 is coupled between the compensation node $N_{COMP}$ and the first differential node DN1.

Figure 3B:
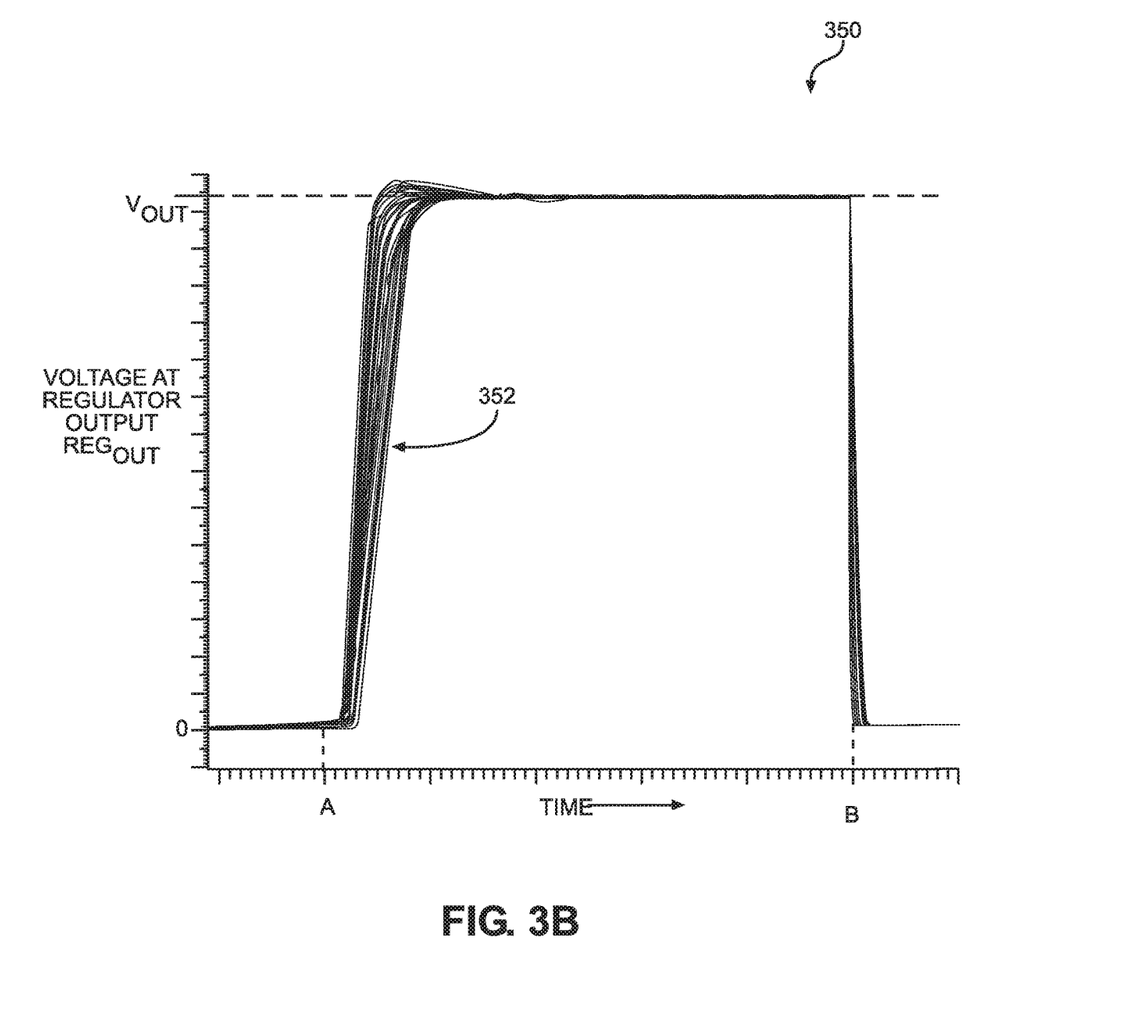
FIG. 3B is a diagram illustrating the simulated supply voltage at the regulator output of the LDO voltage regulator in FIG. 3A over a plurality of corners in response to a transient created by activating the power source.

A diagram 350 in FIG. 3B illustrates the simulated transient response of the LDO voltage regulator 300 in FIG. 3A. The traces 352 in the diagram 350 indicate that the LDO voltage regulator 300, including the compensation circuit 302, provides a good transient response over all corners. Compared to the diagrams 150 and 250 of FIGS. 1B and 2B, respectively, the transient response in the diagram 350 is significantly better than the transient response of the LDO voltage regulator 200 in FIG. 2A, and is comparable to that of the LDO voltage regulator 100 in FIG. 1A. The first compensation capacitor 306 in the LDO voltage regulator 300 may be subjected to the source voltage $V_{DD}$ under some conditions, so the first compensation capacitor 306 must be implemented as a MIM capacitor in a typical semiconductor process. The second compensation capacitor 308 will not be subjected to the full source voltage $V_{DD}$ and, therefore, may be implemented as a MOS capacitor.

The diagrams 150 in FIG. 1B, 250 in FIG. 2B, and 350 in FIG. 3B are based on simulated transient responses with a same simulated load circuit coupled to the regulator output $REG_{OUT}$. The transient response in the diagram 350 is achieved with the first and second compensation capacitors 306 and 308 having particular sizes (e.g., capacitance values, which correspond to an area) set according to such load. The sizes of the first and second compensation capacitors 306 and 308 employed in the LDO voltage regulator 300 may be varied to achieve a good transient response under different load conditions. The simulated transient response in the diagram 350 in FIG. 3B is based on a size of the MOS second compensation capacitor 308 in the compensation circuit 302 corresponding to the size of the MOS compensation capacitor 204 in the compensation circuit 202. However, the size of the MIM first compensation capacitor 306 in the LDO voltage regulator may be only about 40% of the size of the MIM compensation capacitor 140 in the LDO voltage regulator 100. Thus, the compensation circuit 302 that employs the MOS second compensation capacitor 308 providing indirect compensation in addition to the MIM first compensation capacitor 306 allows a size of the MIM first compensation capacitor 306 to be reduced by as much as 60% compared to the size of the MIM compensation capacitor 140 in the LDO voltage regulator 100. Depending on the load of the circuit to be powered by the supply voltage $V_{OUT}$, achieving the transient response shown in the diagram in FIG. 3B may require the size of the second compensation capacitor 308 in the LDO voltage regulator 300 to be greater than or less than 40% of the size of the compensation capacitor 140 in the LDO voltage regulator 100.

In another aspect, the LDO voltage regulator 300 in FIG. 3A takes advantage of the fact that the first compensation capacitor 306 is a MIM capacitor and the second compensation capacitor 308 is a MOS capacitor to reduce a total area needed for the first and second compensation capacitors 306 and 308. By forming the MIM first compensation capacitor 306 on the MOS second compensation capacitor 308 in a given semiconductor process, a stacked capacitor structure may be formed. In this way, the stacked capacitor structure includes the first and second compensation capacitors 306 and 308 in a same area. The second compensation capacitor 308 may be a polysilicon-oxide-semiconductor capacitor.

Figure 4:
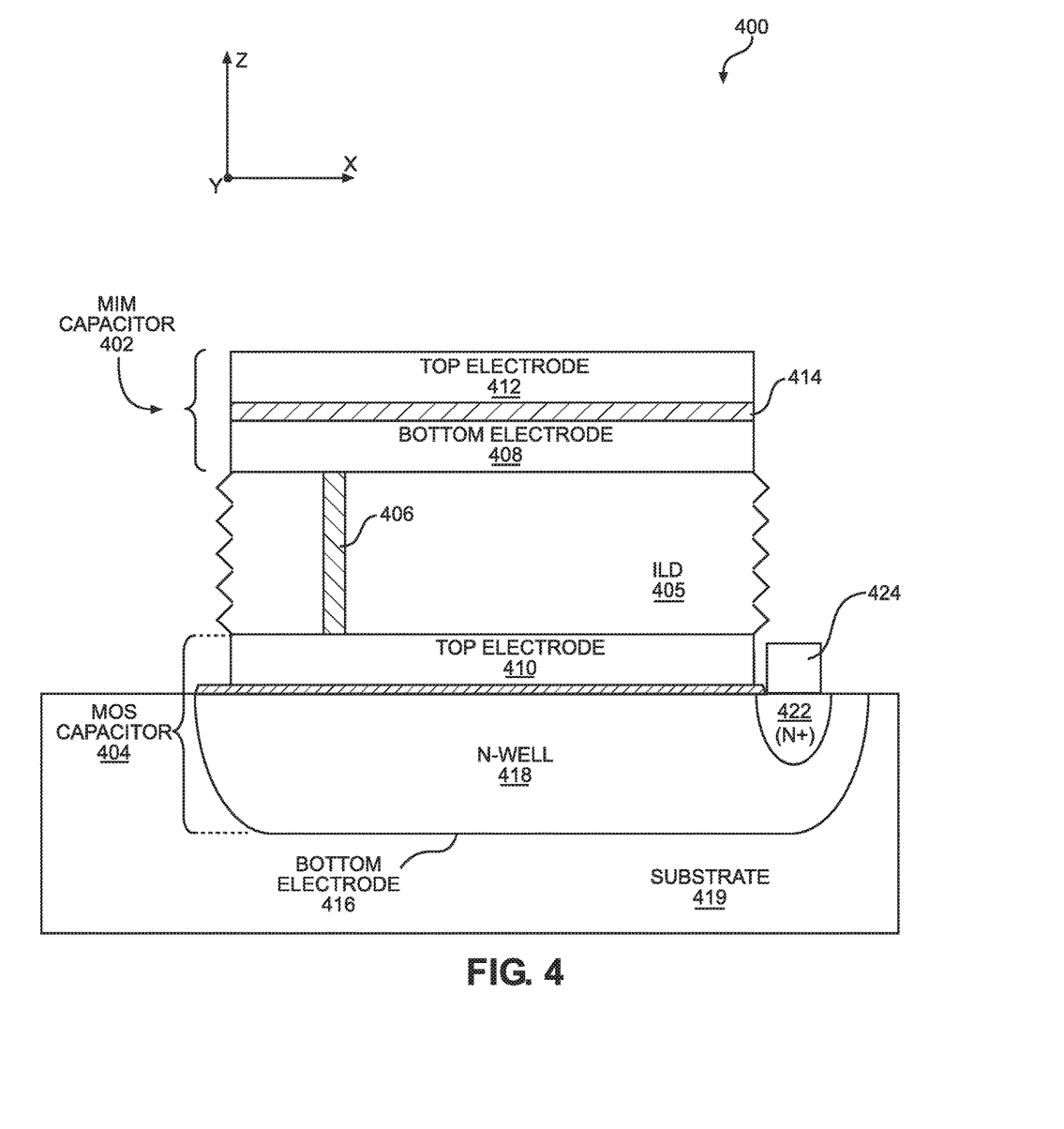
FIG. 4 is a cross-sectional side view of an exemplary MIM/MOS stacked capacitor structure for the LDO voltage regulator in FIG. 3A.

FIG. 4 is a cross-sectional side view of an exemplary stacked capacitor structure 400 that may be employed in the LDO voltage regulator 300 of FIG. 3A to achieve a good transient response (e.g., comparable to that of the LDO voltage regulator 100 of FIG. 1A) in a smaller area than occupied by the LDO voltage regulator 100. As noted, the stacked capacitor structure 400 including the first compensation capacitor 306 and the second compensation capacitor 308 may be much smaller than the MIM compensation capacitor 140 employed in the LDO voltage regulator 100. By employing the stacked capacitor structure 400, the LDO voltage regulator 300 occupies significantly less area (e.g., of a semiconductor) than the LDO voltage regulator 100 but maintains a good transient response. In this regard, a total area of the LDO voltage regulator 300 is reduced and wiring congestion is improved.

As shown in FIG. 4, the stacked capacitor structure 400 includes a MIM capacitor 402 formed over a MOS capacitor 404. The MIM capacitor 402 and the MOS capacitor 404 are separated by an inner-layer dielectric (ILD) 405. A via 406 through the ILD 405 electrically couples a bottom electrode 408 of the MIM capacitor 402 to a top electrode 410 of the MOS capacitor 404. The MIM capacitor 402 also includes a top electrode 412 separated from the bottom electrode 408 by MIM dielectric 414. The top electrode 412 and the bottom electrode 408 of the MIM capacitor 402 may be formed in different metal layers of an integrated circuit. The MIM dielectric 414 may be a layer of an oxide such as silicon dioxide ($SiO_2$) or silicon nitride ($Si_3N_4$), for example. Although the acronym "MOS" refers to a metal top electrode, the top electrode 410 of the MOS capacitor 404 is not limited to metal and may alternatively be formed of polysilicon or other conductive material.

The MOS capacitor 404 further includes a bottom electrode 416 formed by N-well 418 in substrate 419. The N-well 418 is separated from the top electrode 410 of the MOS capacitor 404 by a MOS dielectric 420 formed on the N-well 418. The MOS dielectric 420 may also be a layer of an oxide such as $SiO_2$ or $Si_3N_4$, for example. The N-well 418 includes an N+ doped region 422 and a contact 424 formed on the N+ doped region 422. The contact 424 may be formed of metal disposed on the N+ doped region 422. The N+ doped region 422 may be doped with a higher concentration of doping atoms than the N-well 418 in order to form a low-resistance ohmic contact.

The dimensions of the MIM capacitor 402 and the MOS capacitor 404 and their features in FIG. 4 are not drawn to scale. In one example, the combined structure of the MIM capacitor 402 and the MOS capacitor 404 may have an area that is 60% smaller than the area of the MIM compensation capacitor 140 in the circuit in FIG. 1A. If the MIM capacitor 402 is formed over the MOS capacitor 404, the area of the stacked capacitor structure 400 in the example may be equal to the area of the MIM capacitor 402 or the MOS capacitor 404, whichever is larger. In this regard, the MIM capacitor 402 may be stacked directly on the MOS capacitor 404, such that an axis orthogonal to a plane of the MIM capacitor 402 extends in a first direction (e.g., Y-axis direction in FIG. 4) through the MOS capacitor 404. The MIM capacitor 402 may be fully within the area of the MOS capacitor 404, or the MOS capacitor 404 may be fully within the area of the MIM capacitor 402.

As discussed above, the stacked capacitor structure 400 may be employed in the LDO voltage regulator 300 of FIG. 3A to provide the first compensation capacitor 306 and the second compensation capacitor 308 occupying less area than the MIM compensation capacitor 140 in the LDO voltage regulator 100 of FIG. 1A. In this regard, the top electrode 412 of the MIM capacitor 402 is coupled to the first cascode output node CDA1 of the first gain stage 102, which is coupled to the control node of the gain transistor 130 in the second gain stage 104. The bottom electrode 408 of the MIM capacitor 402 is coupled to the top electrode 410 of the MOS capacitor 404 by the via 406, and together such features comprise the compensation node $N_{COMP}$. Thus, the bottom electrode 408 of the MIM capacitor 402 is also coupled to the compensation resistor 304 in FIG. 3A. A connection to the contact 424 is employed to couple the bottom electrode 416 of the MOS capacitor 404 to the first differential node DN1 of the first gain stage 102 in FIG. 3A.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Those skilled in the art will recognize improvements and modifications to the preferred embodiments of the present disclosure. All such improvements and modifications are considered within the scope of the concepts disclosed herein and the claims that follow.

What is claimed is:

1. A low drop-out (LDO) voltage regulator, comprising:
   a first gain stage, comprising:
      a cascode differential amplifier, comprising:
         a differential pair configured to generate a voltage difference between a first differential node and a second differential node based on a difference between a reference voltage and a feedback voltage; and
         a first cascode circuit coupled between the first differential node and a first cascode output node;
   a second gain stage configured to generate a supply voltage on a regulator output based on a first output voltage at the first cascode output node; and
   a compensation circuit, comprising:
      a compensation resistor coupled between the regulator output and a compensation node;
      a first compensation capacitor coupled between the compensation node and the first cascode output node, such that the first compensation capacitor and the compensation resistor are coupled in series between the first cascode output node and the regulator output; and
      a second compensation capacitor coupled between the compensation node and the first differential node, such that the second compensation capacitor and the compensation resistor are coupled in series between the first differential node and the regulator output.

2. The LDO voltage regulator of claim 1, wherein:
   the cascode differential amplifier further comprises a second cascode circuit coupled between the second differential node and a second cascode output node; and
   the first gain stage further comprises a current mirror circuit coupled to the first cascode output node and the second cascode output node.

3. The LDO voltage regulator of claim 2, wherein:
   the current mirror circuit and the second gain stage are each configured to receive a source voltage from a voltage source.

4. The LDO voltage regulator of claim 3, wherein:
   the first compensation capacitor comprises a metal-insulator-metal (MIM) capacitor configured to charge to the source voltage.

5. The LDO voltage regulator of claim 1, wherein:
   the second compensation capacitor comprises a metal-oxide-semiconductor (MOS) capacitor.

6. The LDO voltage regulator of claim 1, wherein:
   the second compensation capacitor comprises a polysilicon-oxide-semiconductor or polysilicon-nitride-semiconductor capacitor.

7. The LDO voltage regulator of claim 1, wherein:
   the first compensation capacitor is stacked on the second compensation capacitor.

8. The LDO voltage regulator of claim 1, wherein:
   the first compensation capacitor is stacked directly above the second compensation capacitor, such that an axis orthogonal to a plane of the first compensation capacitor extends in a first direction through the second compensation capacitor.

9. The LDO voltage regulator of claim 2, wherein:
   the first cascode circuit comprises a first cascode transistor, comprising:
      a control node coupled to a bias voltage;
      a first current node coupled to the first differential node; and
      a second current node coupled to the first cascode output node; and
   the second cascode circuit comprises a second cascode transistor, comprising:
      a control node coupled to the bias voltage;
      a first current node coupled to the second differential node; and
      a second current node coupled to the second cascode output node.

10. The LDO voltage regulator of claim 9, wherein:
    the first and second cascode circuits each comprise field-effect transistors (FETs).

11. The LDO voltage regulator of claim 9, wherein:
    the first and second cascode circuits each comprise bipolar junction transistors (BJTs).

12. The LDO voltage regulator of claim 1, wherein:
    the differential pair comprises:
       a first transistor, comprising:
          a control node configured to receive the reference voltage;
          a first current node coupled to a common voltage; and
          a second current node coupled to the first differential node; and
       a second transistor, comprising:
          a control node configured to receive the feedback voltage;
          a first current node coupled to the common voltage; and
          a second current node coupled to the second differential node.

13. The LDO voltage regulator of claim 2, wherein the current mirror circuit comprises:
    a gate-drain shorted transistor, comprising:
       a control node and a first current node each coupled to the second cascode output node; and
       a second current node configured to receive a source voltage from a voltage source; and
    a mirror transistor comprising:
       a control node coupled to the control node of the gate-drain shorted transistor;
       a first current node coupled to the first cascode output node; and
       a second current node configured to receive the source voltage from the voltage source.

14. The LDO voltage regulator of claim 1, wherein the second gain stage comprises:
   a gain transistor comprising:
      a control node coupled to the first cascode output node;
      a first current node coupled to the regulator output; and
      a second current node configured to receive a source voltage from a voltage source.

15. The LDO voltage regulator of claim 14, wherein the second gain stage further comprises:
   a first divider resistor coupled between the regulator output and a feedback node; and
   a second divider resistor coupled between the feedback node and a ground voltage;
   wherein the second gain stage is further configured to generate the feedback voltage on the feedback node.

* * * * *